United States Patent
Lin et al.

(10) Patent No.: US 10,680,173 B2
(45) Date of Patent: Jun. 9, 2020

(54) RESISTIVE MEMORY, MANUFACTURING METHOD THEREOF AND CHEMICAL MECHANICAL POLISHING PROCESS

(71) Applicant: Winbond Electronics Corp., Taichung (TW)

(72) Inventors: Yu-Jen Lin, Taichung (TW); Yi-Chung Chen, Taichung (TW); Cheng-Jen Lai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 15 days.

(21) Appl. No.: 16/170,056

(22) Filed: Oct. 25, 2018

(65) Prior Publication Data

US 2019/0131522 A1    May 2, 2019

(30) Foreign Application Priority Data

Oct. 27, 2017  (CN) ........................ 2017 1 1025221

(51) Int. Cl.
*H01L 45/00*  (2006.01)
*B24B 1/00*   (2006.01)

(52) U.S. Cl.
CPC ...... *H01L 45/1253* (2013.01); *H01L 45/1233* (2013.01); *H01L 45/146* (2013.01); *H01L 45/1608* (2013.01); *H01L 45/1616* (2013.01); *H01L 45/1666* (2013.01); *H01L 45/1675* (2013.01); *B24B 1/00* (2013.01)

(58) Field of Classification Search
CPC ............. H01L 21/3212; H01L 45/1608; H01L 45/1666; H01L 45/1616
See application file for complete search history.

(56) References Cited

U.S. PATENT DOCUMENTS

| | | | | |
|---|---|---|---|---|
| 5,209,816 A | * | 5/1993 | Yu ........................ | H01L 21/3212 257/E21.304 |
| 5,340,370 A | * | 8/1994 | Cadien ..................... | C09G 1/02 106/3 |
| 5,866,031 A | * | 2/1999 | Carpio ..................... | C09G 1/02 216/100 |
| 5,993,686 A | * | 11/1999 | Streinz ................ | H01L 21/3213 252/79.3 |
| 6,334,880 B1 | * | 1/2002 | Negrych ............... | C09K 3/1409 106/3 |
| 6,468,135 B1 | * | 10/2002 | Cruz ........................ | B08B 3/02 451/287 |
| 9,172,037 B2 | | 10/2015 | Somaschini et al. | |
| 9,214,386 B2 | | 12/2015 | Liu | |

(Continued)

FOREIGN PATENT DOCUMENTS

| | | |
|---|---|---|
| TW | 201519298 | 5/2015 |
| TW | 201613153 | 4/2016 |

*Primary Examiner* — Douglas M Menz
(74) *Attorney, Agent, or Firm* — JCIPRNET

(57) ABSTRACT

A resistive memory, a manufacturing method thereof, and a chemical mechanical polishing process are provided. The resistive memory includes a first electrode, a variable resistance layer, and a second electrode. The first electrode is disposed on a substrate. The variable resistance layer is disposed on the first electrode. The second electrode is disposed on the variable resistance layer. The first electrode includes a first Ti layer, a Ti oxide layer, and a conductive layer sequentially disposed on the substrate.

13 Claims, 3 Drawing Sheets

(56) References Cited

U.S. PATENT DOCUMENTS

| | | | | |
|---|---|---|---|---|
| 2005/0211952 A1* | 9/2005 | Mace | ............ | C09G 1/02 |
| | | | | 252/79.1 |
| 2005/0214191 A1* | 9/2005 | Mueller | ............ | C09G 1/02 |
| | | | | 423/339 |
| 2007/0281484 A1* | 12/2007 | Ishibashi | ............ | C09G 1/02 |
| | | | | 438/692 |
| 2008/0020578 A1* | 1/2008 | Auer | ............ | C09C 1/3607 |
| | | | | 438/693 |
| 2012/0062858 A1* | 3/2012 | Tanaka | ............ | G03F 7/70341 |
| | | | | 355/30 |
| 2015/0004788 A1* | 1/2015 | Shi | ............ | H01L 21/3212 |
| | | | | 438/693 |

\* cited by examiner ent and a bottom electrode disposed opposite to each other and a variable resistance layer located between the top electrode and the bottom electrode, namely, having a conventionally known metal-insulator-metal (MIM) structure. When a resistive memory is manufactured, a bottom electrode layer, a variable resistance layer, and a top electrode layer are generally sequentially formed on a substrate directly in a deposition chamber.

However, when the substrate has undesirable flatness, flatness of the bottom electrode layer, the variable resistance layer, and the top electrode layer formed on the substrate is affected. Moreover, when the bottom electrode layer, the variable resistance layer, and the top electrode layer do not have excellent flatness, the formed resistive memory cannot exhibit excellent electrical performance.

SUMMARY OF THE INVENTION

The embodiments of the invention provide a chemical mechanical polishing process suitable for polishing a Ti layer on a substrate.

The embodiments of the invention provide a manufacturing method of a resistive memory using the foregoing chemical mechanical polishing process.

The embodiments of the invention provide a resistive memory manufactured by using the foregoing manufacturing method of a resistive memory.

The resistive memory according to an embodiment of the invention includes a first electrode, a variable resistance layer, and a second electrode. The first electrode is disposed on a substrate. The variable resistance layer is disposed on the first electrode. The second electrode is disposed on the variable resistance layer. The first electrode includes a first Ti layer, a Ti oxide layer, and a conductive layer sequentially disposed on the substrate.

The chemical mechanical polishing process according to an embodiment of the invention is suitable for planarizing a Ti layer. The chemical mechanical polishing process includes the following steps: contacting the Ti layer with a polishing pad for performing polishing to remove part of the Ti layer and form a Ti oxide layer on the Ti layer; cleaning the Ti oxide layer by using a neutral solution; cleaning the Ti oxide layer by using an acid solution; separating the Ti oxide layer and the polishing pad in the acid solution; and removing the acid solution on the Ti oxide layer.

The manufacturing method of a resistive memory according to an embodiment of the invention includes the following steps: forming a first Ti layer on a substrate; polishing the first Ti layer through the foregoing chemical mechanical polishing process, and forming the Ti oxide layer on the first Ti layer; forming a conductive layer on the Ti oxide layer; forming a variable resistance layer on the conductive layer; and forming an electrode layer on the variable resistance layer.

Accordingly, the chemical mechanical polishing process of the embodiments of the invention effectively polishes the Ti layer and meanwhile prevents excessive particle residues, such that the polished Ti layer can have a flatter surface. Therefore, the layers subsequently formed on the Ti layer can similarly have excellent flatness, and the resistive memory formed of the layers can exhibit excellent electrical performance.

To provide a further understanding of the aforementioned and other features and advantages of the disclosure, exemplary embodiments, together with the reference drawings, are described in detail below.

DESCRIPTION OF THE EMBODIMENTS

Figure 1:
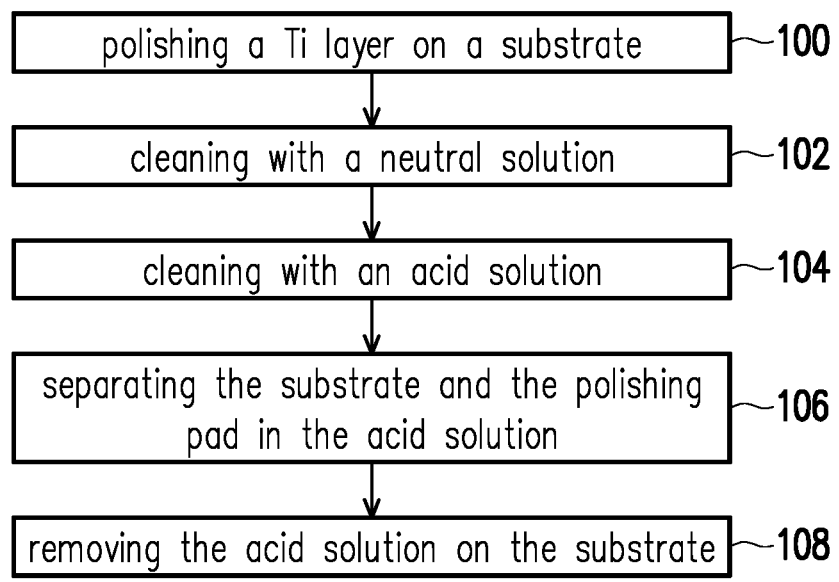
FIG. 1 is a flowchart illustrating a chemical mechanical polishing process according to an embodiment of the invention.

FIG. 1 is a flowchart illustrating a chemical mechanical polishing process according to an embodiment of the invention. Referring to FIG. 1, first, in step 100, a substrate on which a Ti layer is already formed is held on a polishing carrier. Then, the Ti layer is contacted with a polishing pad to perform chemical mechanical polishing on the Ti layer to remove part of the Ti layer (to reduce a thickness of the Ti layer). In the polishing process, the polishing is performed by using an acid slurry and a hydrogen peroxide solution. A pH value of the acid slurry is, for example, smaller than 5, and a concentration of the hydrogen peroxide solution is, for example, smaller than 5%, but the invention is not limited hereto. The acid slurry is used to polish the Ti layer, and the hydrogen peroxide solution is used to enhance polishing stability. In the process of polishing the Ti layer, since the portion of the Ti layer that is in contact with an external environment is oxidized, a Ti oxide layer is formed on a surface of the Ti layer.

Next, in step 102, a neutral cleaning solution (e.g., deionized water) is provided to the polishing pad to perform a first cleaning on the Ti oxide layer. In this step, the acid slurry and particles in the slurry are removed, and the particles are prevented from aggregating on the surface of the substrate (on the Ti oxide layer).

Then, in step 104, an acid cleaning solution is provided to the polishing pad to perform a second cleaning on the Ti oxide layer. The acid cleaning solution includes, for example, an organic compound and a surfactant. In this step, the particles remaining on the substrate surface (on the Ti oxide layer) are further removed. A pH value of the acid cleaning solution is, for example, smaller than 5, but the invention is not limited hereto.

Then, in step 106, with the acid solution remaining, the substrate is removed from the polishing pad to separate the Ti oxide layer from the polishing pad. In the process of separating the Ti oxide layer and the polishing pad, since the acid solution remains, the remaining particles and impurities are prevented from attaching to the Ti oxide layer.

Afterwards, in step 108, a third cleaning is performed to remove the acid solution remaining on the Ti oxide layer. A cleaning solution used in the third cleaning is, for example, an isopropyl alcohol solution. In this step, since the cleaning is performed by using the isopropyl alcohol solution, in addition to removing the remaining acid solution and particles, the substrate is dried at the same time.

According to the chemical mechanical polishing process, the Ti layer on the substrate is effectively polished, and meanwhile excessive particle residues are prevented. Therefore, the polished Ti layer has a flatter surface, which is favorable to a subsequent process.

The chemical mechanical polishing process of the embodiments of the invention is suitable for use in manufacturing of a bottom electrode of a resistive memory to form a bottom electrode having a flat surface. Detailed descriptions are given below.

FIG. 2A to FIG. 2D are cross-sectional schematic diagrams illustrating a manufacturing process of a resistive memory according to an embodiment of the invention. First, referring to FIG. 2A, a Ti layer 204 is formed on a substrate 200. The substrate 200 is, for example, a dielectric substrate in which a conductive plug 202 is already formed. The Ti layer 204 is formed on a surface of the substrate 200 and is in contact with the conductive plug 202. The Ti layer 204 is formed, for example, by performing a chemical vapor deposition process.

Figure 2A:
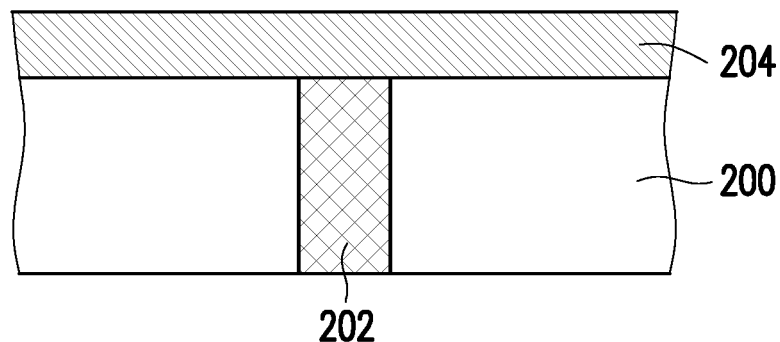
FIG. 2A to FIG. 2D are cross-sectional schematic diagrams illustrating a manufacturing process of a resistive memory according to an embodiment of the invention.
Figure 2B:
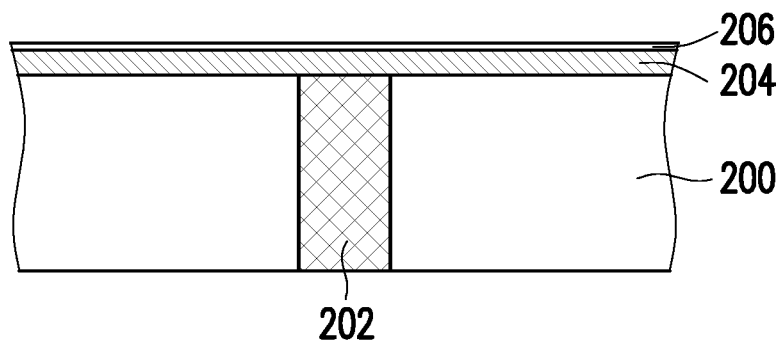

Then, referring to FIG. 2B, through the chemical mechanical polishing process of FIG. 1, part of the Ti layer 204 is removed to reduce a thickness of the Ti layer 204 and meanwhile planarize the Ti layer 204. As mentioned above, the Ti layer 204 is polished through the chemical mechanical polishing process of FIG. 1, so that the Ti layer 204 can have a flat surface, and excessive particle residues can be prevented. Moreover, after the chemical mechanical polishing process is performed, a Ti oxide layer 206 is formed on the Ti layer 204.

Figure 2C:
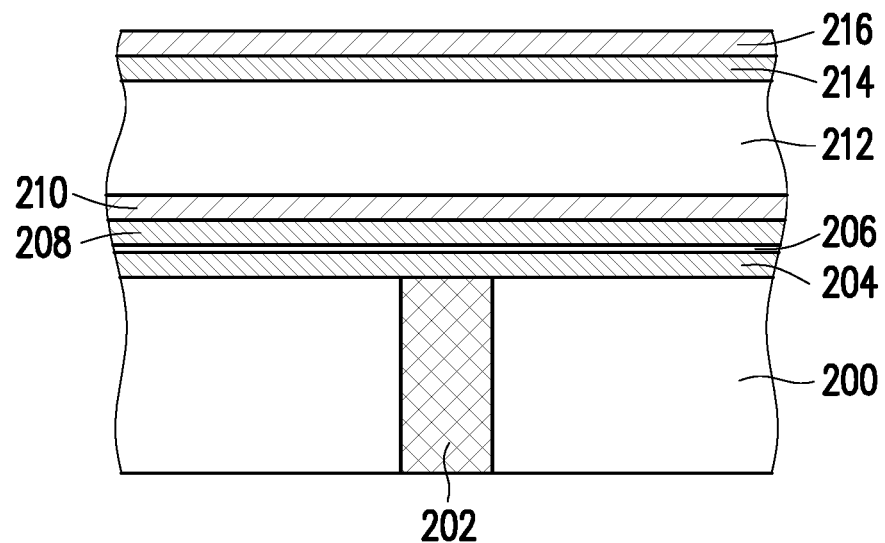

Next, referring to FIG. 2C, a conductive layer is formed on the Ti oxide layer 206. The formed conductive layer, the Ti oxide layer 206, and the Ti layer 204 may form a bottom electrode of a resistive memory in a subsequent step. In the present embodiment, the conductive layer is formed of a Ti layer 208 and a TiN layer 210 sequentially formed on the Ti oxide layer 206, but the invention is not limited hereto. Afterwards, a variable resistance layer 212 is formed on the conductive layer, and an electrode layer is formed on the variable resistance layer 212. In the present embodiment, the electrode layer is formed of a Ti layer 214 and a TiN layer 216 sequentially formed on the variable resistance layer 212, but the invention is not limited hereto. The Ti layer 208, the TiN layer 210, the variable resistance layer 212, the Ti layer 214, and the TiN layer 216 are formed, for example, by the chemical vapor deposition process.

Figure 2D:
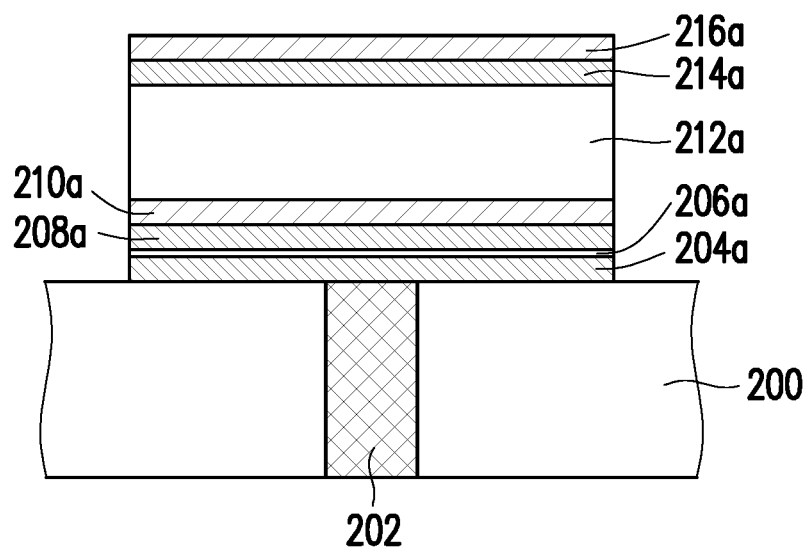

Next, referring to FIG. 2D, a patterning process is performed on the Ti layer 204, the Ti oxide layer 206, the Ti layer 208, the TiN layer 210, the variable resistance layer 212, the Ti layer 214, and the TiN layer 216 to define the resistive memory of the embodiments of the invention, wherein a patterned Ti layer 204*a*, a patterned Ti oxide layer 206*a*, a patterned Ti layer 208*a*, and a patterned TiN layer 210*a* form the bottom electrode of the resistive memory, a patterned Ti layer 214*a* and a patterned TiN layer 216*a* form a top electrode of the resistive memory, and a patterned variable resistance layer 212*a* is located between the top electrode and the bottom electrode.

In the present embodiment, since the Ti layer 204 polished through the chemical mechanical polishing process of FIG. 1 has excellent flatness, the layers subsequently formed thereon can similarly have excellent flatness. Accordingly, the formed resistive memory can exhibit excellent electrical performance.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A chemical mechanical polishing process suitable for planarizing a Ti layer, the chemical mechanical polishing process comprising:
   contacting the Ti layer with a polishing pad for performing polishing to remove part of the Ti layer and form a Ti oxide layer on the Ti layer;
   cleaning the Ti oxide layer by using a neutral solution;
   cleaning the Ti oxide layer by using an acid solution;
   separating the Ti oxide layer and the polishing pad in the acid solution; and
   removing the acid solution on the Ti oxide layer.

2. The chemical mechanical polishing process according to claim 1, wherein an acid slurry and a hydrogen peroxide solution are used when the polishing is performed.

3. The chemical mechanical polishing process according to claim 2, wherein a pH value of the acid slurry is smaller than 5, and a concentration of the hydrogen peroxide solution is smaller than 5%.

4. The chemical mechanical polishing process according to claim 1, wherein the neutral solution comprises deionized water.

5. The chemical mechanical polishing process according to claim 1, wherein the acid solution comprises an organic compound and a surfactant.

6. The chemical mechanical polishing process according to claim 1, wherein a method of removing the acid solution comprises using an isopropyl alcohol solution.

7. A manufacturing method of a resistive memory, comprising:
   forming a first Ti layer on a substrate;
   polishing the first Ti layer through the chemical mechanical polishing process according to claim 1, and forming the Ti oxide layer on the first Ti layer;
   forming a conductive layer on the Ti oxide layer;
   forming a variable resistance layer on the conductive layer; and
   forming an electrode layer on the variable resistance layer.

8. The manufacturing method of a resistive memory according to claim 7; wherein the step of forming the conductive layer comprises:
   forming a second Ti layer on the Ti oxide layer; and
   forming a TiN layer on the second Ti layer.

9. The manufacturing method of a resistive memory according to claim 7, wherein the chemical mechanical polishing process uses an acid slurry and a hydrogen peroxide solution when the polishing is performed.

10. The manufacturing method of a resistive memory according to claim 9, wherein a pH value of the acid slurry is smaller than 5, and a concentration of the hydrogen peroxide solution is smaller than 5%.

11. The manufacturing method of a resistive memory according to claim 7, wherein the neutral solution comprises deionized water.

12. The manufacturing method of a resistive memory according to claim 7, wherein the acid solution comprises an organic compound and a surfactant.

13. The manufacturing method of a resistive memory according to claim 7, wherein a method of removing the acid solution comprises using an isopropyl alcohol solution.

* * * * *